United States Patent
Afshar

(10) Patent No.: US 10,541,267 B2
(45) Date of Patent: Jan. 21, 2020

(54) LIGHT-EMITTING ASSEMBLY AND METHOD FOR PRODUCING A LIGHT-EMITTING ASSEMBLY

(71) Applicant: OSRAM Opto Semiconductors GmbH, Regensburg (DE)

(72) Inventor: Farhang Ghasemi Afshar, Wenzenbach (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 16/060,021

(22) PCT Filed: Oct. 4, 2016

(86) PCT No.: PCT/EP2016/073700
§ 371 (c)(1),
(2) Date: Jun. 6, 2018

(87) PCT Pub. No.: WO2017/097454
PCT Pub. Date: Jun. 15, 2017

(65) Prior Publication Data
US 2018/0337215 A1    Nov. 22, 2018

(30) Foreign Application Priority Data

Dec. 7, 2015   (DE) .................. 10 2015 224 434

(51) Int. Cl.
*A61L 2/08* (2006.01)
*H01L 27/15* (2006.01)
*H01L 33/58* (2010.01)

(52) U.S. Cl.
CPC ............ *H01L 27/156* (2013.01); *H01L 33/58* (2013.01)

(58) Field of Classification Search
None
See application file for complete search history.

(56) References Cited

U.S. PATENT DOCUMENTS

| | | | |
|---|---|---|---|
| 2002/0015573 A1* | 2/2002 | Ishibashi | G02B 6/3536 |
| | | | 385/147 |
| 2012/0019737 A1 | 1/2012 | Nakai et al. | |
| 2019/0167826 A1* | 6/2019 | Winslow | F21V 29/70 |

FOREIGN PATENT DOCUMENTS

| | | |
|---|---|---|
| DE | 102009032886 A1 | 2/2011 |
| DE | 102012203791 A1 | 9/2013 |

(Continued)

OTHER PUBLICATIONS

A. Teupner et al.: "Merit function for the evaluation of color uniformity in the far field of LED spot lights" Proc. SPIE 9003, Light-Emitting Diodes: Materials, Devices and Applications for Solid State Lighting XVIII, 900303 (Feb. 27, 2014), doi:10.1117/12.2043545.

(Continued)

*Primary Examiner* — Ali Naraghi
(74) *Attorney, Agent, or Firm* — McDermott Will & Emery LLP

(57) ABSTRACT

A light-emitting assembly is provided in different embodiments. The light-emitting assembly comprises: a substrate (22); first light-emitting components (31) arranged on the substrate (22) along a first line and emitting first light of a first colour; second light-emitting components (33) arranged on the substrate (22) along a second line and emitting second light of a second colour, wherein the first line runs laterally next to the second line; and multiple optical waveguides (44) for guiding the light, which are arranged over the light-emitting components (31, 33), extend in the direction from the first line to the second line, and cross the first line and the second line.

16 Claims, 4 Drawing Sheets

(56) References Cited

FOREIGN PATENT DOCUMENTS

| | | |
|---|---|---|
| DE | 102013205179 A1 | 9/2014 |
| JP | 2010272274 A | 12/2010 |
| WO | 2005103556 A1 | 11/2005 |

OTHER PUBLICATIONS

A. Teupner: "Color Uniformity in Spotligths—Visual Perception and System Design" Thesis (Doctoral), E.T.S.I. Telecomunication (UPM), 2015.

* cited by examiner

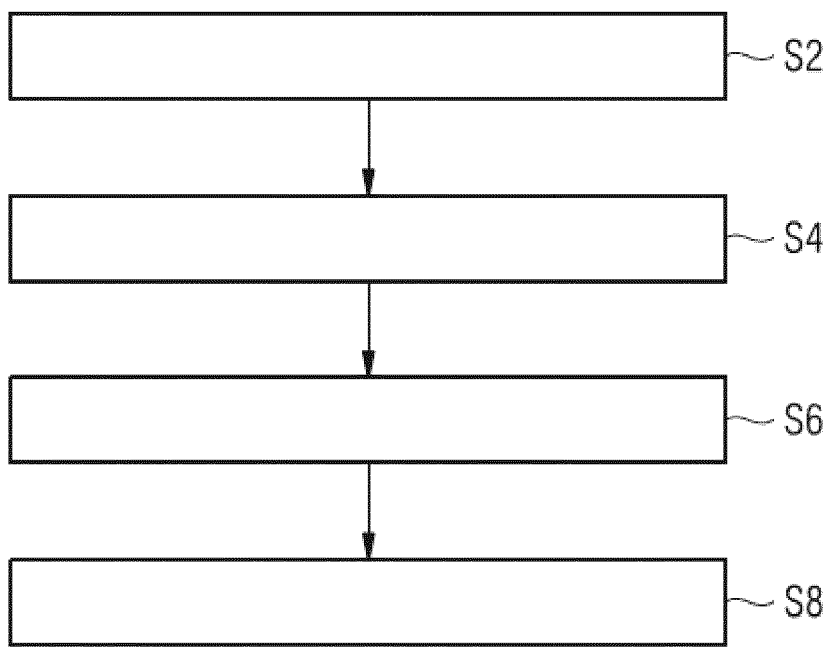

LIGHT-EMITTING ASSEMBLY AND METHOD FOR PRODUCING A LIGHT-EMITTING ASSEMBLY

CROSS-REFERENCE OF RELATED APPLICATIONS

This application is the U.S. National Phase under 35 U.S.C. § 371 of International Patent Application No. PCT/EP2016/073700, filed on Oct. 4, 2016, which in turn claims the benefit of German Application No. 10 2015 224 434.2 filed on Dec. 7, 2015, the entire disclosures of which Applications are incorporated by reference herein.

The invention relates to a light-emitting assembly and a method for producing a light-emitting assembly.

For a conventional light-emitting assembly, for example a light-emitting diode arrangement, a plurality of LEDs are arranged on a substrate and are electrically connected to conductor tracks formed on the substrate. The LEDs can be electrically connected in parallel and/or electrically in series. For example, the LEDs of one group of LEDs can be electrically connected in series, the LEDs of another group of LEDs can be electrically connected in series and the two groups can be electrically connected in parallel. The LEDs can be formed identically in construction or differently. For example, one group of LEDs can have surface-emitting light-emitting diodes which typically have an electrical contact on their upper side and an electrical contact on their lower side, and another group of LEDs can comprise volume-emitting light-emitting diodes which typically have both electrical contacts on their upper side. Furthermore, one group of LEDs can have light-emitting diodes emitting blue light, while another group of LEDs can have light-emitting diodes emitting red light and another group of LEDs can have light-emitting diodes emitting green light. The LEDs can be formed for instance on a substrate which has a ceramic base body on which the conductor tracks are formed for electrically contacting the LEDs.

One or more conversion layers can be formed on the LEDs. For example, a first conversion layer can be formed on a first group of LEDs and a second conversion layer can be formed on a second group of LEDs. The conversion layers can each have a carrier material into which a converter material is embedded. The converter material can comprise converter particles. Alternatively, the conversion layers can be made of the converter material. The converter material is suitable for converting light with respect to its wavelength. For example, the LEDs of one group of LEDs emit blue light, wherein the converter material absorbs at least one portion of the blue light and emits yellow or hazy blue light. The yellow and/or hazy blue light are/is mixed with the remaining unconverted blue light, as a result of which white light can be generated. Alternatively, the blue light can be converted into yellow light by the converter material and the blue light can be converted into bluish white light by another converter material, as a result of which adjustable or tunable white light can be generated.

Furthermore, green light can be generated by a first group of LEDs, for example by means of blue light-emitting LEDs and a conversion layer absorbing the blue light and emitting the green light, red light can be generated by a second group of LEDs, for example directly or by means of one corresponding conversion layer, and blue light or white light can be generated by a third group of LEDs for example directly or by means of a corresponding conversion layer. An LED having the associated conversion layer or the associated part of the conversion layer, i.e. the part of the conversion layer arranged directly above the corresponding LED, can also be referred to as a light-emitting component.

Due to the electrical coupling of the LEDs within a group, the LEDs of one group are preferably arranged closely adjacent to each other, for example in the form of linearly extending light-emitting diode strings. If two adjacent light-emitting diode strings with or without a corresponding conversion layer generate light of different colors, in a sufficient distance, a certain rate of light mixing is achieved, this light mixing rate, however, may not be sufficient in some applications, for example in the case of using of a non-faceted and/or smooth reflector for reflecting the mixed light. In particular, this can lead to the formation of regions of different colors and/or to a rainbow effect when projecting the mixed light onto a surface.

The light mixing can be improved if the light-emitting diodes are directly applied to the substrate (chip-on-board technology) instead of using LEDs packed in separate housings on the substrate. In particular, the distance between the locations of emission of different colors can thereby be reduced, thus leading to a better light mixing.

FIG. 1 shows a plan view of a conventional light-emitting assembly, in particular a three-channel RGB light core. The conventional light-emitting assembly has a light-emitting diode arrangement 20. The light-emitting diode arrangement 20 comprises a substrate 22 and a plurality of light-emitting components arranged on the substrate 22 and electrically coupled to the conductor tracks of the substrate which are not shown here. Furthermore, a dam 24 is formed on the substrate 22 which in FIG. 1 protrudes at the drawing plane from the substrate 22 and surrounds the light-emitting components 31, 33, 35 in the radial direction.

The light-emitting components comprise in particular first light-emitting components 31 forming first light-emitting diode strings 30, second light-emitting components 33 forming second light-emitting diode strings 32, and third light-emitting components 35 forming third light-emitting diode strings 34. The first light-emitting components 31 emit light of a first color, for example red light. The second light-emitting components 33 emit light of a second color, for example green light. The third light-emitting components 35 emit light of a third color, for example blue light. The light-emitting components 31, 33, 35 can each have an LED. Optionally, the light-emitting components 31, 33, 35 can have in each case a conversion layer or a part of a conversion layer which is formed above the corresponding LED and converts the light emitted by the corresponding LED. For example, all LEDs emit blue light and the conversion layers of the first light-emitting components 31 convert the blue light into red light and the conversion layers of the second light-emitting components 33 convert the blue light into green light.

The light-emitting diode strings 30, 32, 34 each extend along a line. In particular, the first light-emitting diode strings 30 extend along first lines which are represented by dashed lines in the figures. The second light-emitting diode strings 32 extend along second lines represented by dotted lines in the figures. The third light-emitting diode strings 34 extend along third lines which are represented as dash-dot lines in the figures. The first, second and third lines are oriented straight, laterally next to one another and parallel to one another in the lateral direction. Accordingly, the light-emitting diode strings 30, 32, 34 are also arranged straight, laterally next to one another and parallel to one another in the lateral direction. Thus, all light-emitting components 31, 33, 35 emitting light of the same color are arranged along a straight line, and light-emitting components 31, 33, 35 emitting light of different colors are arranged laterally next to one another at right angles to these lines.

If light of different colors emitted by the light-emitting components 31, 33, 35 is to be mixed, for example for generating white light, a casting material having a high density of scattering particles can be applied to the light-emitting diode arrangement 20 within the dam 24. The scattering particles can comprise TiO2 or Al2O3, for example. The scattering particles scatter the light of different colors and mix it so that in overall the light-emitting diode arrangement 20 emits white light. However, the scattering particles have a negative effect on the efficiency of the light-emitting diode arrangement 20. This effect increases with increasing density of scattering particles. Thus, the efficiency of the light-emitting diode arrangement 20 decreases as the mixing of light becomes better.

If the scattering particles are arranged at a relatively large distance from the light-emitting components 31, 33, 35, this effect of light mixing using scattering particles can be intensified. This can be achieved, for example, if the dam 24 is formed to be relatively high and a large amount of casting material is introduced inside the dam 24. Subsequently, the scattering particles are introduced into the casting material in such a way such that they are located essentially on the surface of the casting material, as a result of which they have the desired distance from the light-emitting components 31, 33, 35. Then, during operation of the light-emitting diode arrangement 20, the light emitted by the light-emitting components 31, 33, 35 already has a certain light mixture before arriving at the scattering particles, thus the effect of light mixing is enhanced. However, a significant portion of the generated light is absorbed by the dam and the efficiency of the light-emitting diode arrangement 20 decreases with increasing height of the dam 24.

Alternatively or additionally, for the purpose of light mixing, the light-emitting components 31, 33, 35 emitting light of different colors can be arranged very close to one another and/or regions in which light of the same color is emitted can be kept particularly small. However, this increases the complexity and the effort in the production of the light-emitting components 31, 33, 35, for example of the corresponding conversion layers, and/or in arranging and electrically contacting the corresponding LEDs.

An object of the invention is to provide a light-emitting assembly which generates light having a high rate of light mixing and has a particularly high efficiency and/or which can be produced in a particularly simple and/or cost-effective manner.

An object of the invention is to provide a method for producing a light-emitting assembly which contributes to generating light having a high rate of light mixing and which has a particularly high efficiency and/or which can be carried out in a particularly simple and/or cost-effective manner.

An object of the invention is to provide a light mixer for a light-emitting assembly which contributes to generating light having a high rate of light mixing and which has a particularly low effect on the efficiency of the light-emitting assembly and/or which can be formed and/or can be integrated into the light-emitting module in a particularly simple and/or cost-effective manner.

According to one aspect of the invention, the object is solved by a light-emitting assembly comprising a substrate, first light-emitting components being arranged on the substrate along a first line and emitting first light of a first color, second light-emitting components being arranged on the substrate along a second line and emitting second light of a second color, wherein the first line runs laterally next to the second line, and a plurality of rod-shaped optical waveguides for guiding light arranged over the light-emitting components, extending in a direction from the first line to the second line and intersecting the first line and the second line.

A part of the light emitted by light-emitting components is coupled into the rod-shaped optical waveguides. The light coupled into the rod-shaped optical waveguides is guided within the optical waveguides, in particular from one of the lines to another one of the lines, and can exit there from the optical waveguide and mix with the light generated at the other line before or after leaving the optical waveguide. The rod-shaped optical waveguides are spaced apart from one another so that light, which is generated by the light-emitting components and is not coupled into the rod-shaped optical waveguides, can pass the rod-shaped optical waveguides and exit from the light-emitting assembly without being coupled into the rod-shaped optical waveguides.

Since the light-emitting components emitting light of the same color are arranged along the corresponding lines, it is sufficient for light to be mixed from one of the lines to another one of the lines by means of the optical waveguides. Mixing the light along the same line is not necessary, since the light guided along the same line always has the same color and then light of one color would be mixed with light of the same color. Furthermore, such a mixing of light along the same line would result in loss of light and thus in a reduction of the efficiency of the light-emitting assembly. The rod-shaped optical waveguides extending from one line to the other line mixes the light generated along the one line and having one color with the light generated along the other line and having another color. As a result, a particularly high rate of light mixing is achieved.

Interspaces extending from one of the rod-shaped optical waveguides to another one of the rod-shaped optical waveguides extend along the lines, for which reason no light mixing is necessary in these interspaces and the interspaces can remain free of material, for example of potting material and/or of scattering particles. Hence, light generated by the light-emitting components can exit from the light-emitting assembly through the interspaces in an unhindered manner. This contributes to the fact that the rod-shaped optical waveguide have a particularly low effect on the efficiency of the light-emitting assembly and that the light-emitting assembly has a particularly high efficiency.

By arranging the light-emitting components along the lines and arranging the rod-shaped optical waveguides in such a way that they extend from one of the lines to another one of the lines, a particularly high rate of light mixing with particularly low negative effects on the efficiency of light-emitting assembly is achieved. Furthermore, the rod-shaped optical waveguides can be formed and arranged above the light-emitting components in a particularly simple manner. This can lead to a particularly simple and cost-effective production of the light-emitting assembly. Moreover, the light-emitting assembly comprising the rod-shaped waveguides can be of relatively compact design, for example having a height of less than 4 mm.

The light-emitting components arranged along one of the lines and emitting light of the same color form one light-emitting diode string. Thus, the light-emitting assembly has at least two light-emitting diode strings, in particular a first light-emitting diode string comprising the first light-emitting components, and a second light-emitting diode string comprising the second light-emitting components.

The rod-shaped optical waveguides together form a light mixer. The rod-shaped optical waveguides can be physically connected to one another, for example, the rod-shaped optical waveguides can be formed from one piece of material. The optical waveguides and/or the light mixer can be transparent or translucent. For example, the optical waveguides or the light mixer can be formed from a transparent carrier material in which scattering particles are embedded. Alternatively, the optical waveguides or the light mixer can be formed from a light-scattering material.

The light-emitting components and the substrate form a light-emitting diode arrangement. The light-emitting diode arrangement and the light mixer form the light-emitting assembly. Optionally, the light-emitting assembly can also have one, two or more active or passive electronic components, for example for operating the light-emitting assembly.

According to one development, the first line and/or the second line are straight in the lateral direction. Thus, the light-emitting diode strings are also straight. In other words, the lines or light-emitting diode strings are not curved. This can lead to the fact that the light-emitting components of one of the light-emitting diode strings can be arranged on the substrate and/or electrically coupled to the substrate a particularly simple manner.

According to one development, the first line and the second line are parallel to one another. Thus, the light-emitting diode strings are parallel to one another. In other words, the lines or light-emitting diode strings do not intersect. This can lead to the fact that the light-emitting components of one of the light-emitting diode strings can be arranged on the substrate and/or electrically coupled to the substrate in a particularly simple manner.

According to a further development, the optical waveguides are straight in the lateral direction. In other words, the optical waveguides are not curved. This can contribute to a particularly simple production of the optical waveguides or of the light mixer and/or to a particularly good light mixing.

According to a further development, the optical waveguides intersect the lines at a right angle. This contributes to the fact that light coupled into the optical waveguides can be mixed with light generated at another line already after shortest possible path length within the corresponding light waveguide. This can result in a particularly good light mixing.

According to one development, the light-emitting assembly comprises third light-emitting components which are arranged on the substrate along a third line and emit third light of a third color, wherein the third line is arranged laterally next to the first line and the second line and intersects the optical waveguides. The third light-emitting components form a third light-emitting diode string which extends along the third line. The third line can be straight and aligned parallel to the first and/or the second line and intersects the rod-shaped optical waveguides in particular at a right angle. The third light-emitting components enable the possibility of mixing light of three different colors with each other.

According to one development, the light-emitting assembly comprises a plurality of first lines of first light-emitting components, a plurality of second lines of second light-emitting components and/or a plurality of third lines of third light-emitting components. In other words, the light-emitting assembly has a plurality of first, second and/or third light-emitting diode strings. Hence, all light-emitting diode strings comprising the first light-emitting components can be referred to as first light-emitting diode strings, and all lines along which the first light-emitting components are arranged can be referred to as first lines. Thus, all light-emitting diode strings comprising the second light-emitting components can be referred to as second light-emitting diode strings, and all lines along which the second light-emitting components are arranged can be referred to as second lines. Hence, all light-emitting diode strings comprising the third light-emitting components can be referred to as third light-emitting diode strings, and all lines along which the third light-emitting components are arranged can be referred to as third lines.

According to a further development, in the vertical direction, the optical waveguides have a predetermined distance greater than zero towards the light-emitting components. In other words, there is an interspace between the optical waveguides and the light-emitting components. The interspace can be filled, for example, with a filling material and/or a gas, for example with air. This has the effect that the light emitted by the light-emitting components can already be mixed before being coupled into the optical waveguides. This can result in a particularly good light mixing. Furthermore, the interspace serves as thermal insulation of the light mixer from the light-emitting diode arrangement. The distance or the interspace thus contributes to the fact that the light mixer is only slightly heated during the operation of the light-emitting assembly. This leads to particularly large choice of possible materials which can be used for forming the light mixer, in particular the optical waveguides, since there are only low requirements regarding the thermal stability of the material.

According to one development, the light-emitting assembly comprises an edge body which is physically connected to the optical waveguides, is arranged on the substrate and protrudes from the substrate in the vertical direction. The edge body serves for holding and/or connecting the optical waveguides. The edge body can be formed, for example, in one piece with the optical waveguides. The edge body and the optical waveguides form the light mixer. The edge body can be transparent or translucent, in particular, the edge body can be made of the same material such as the optical waveguides.

Light coupled into the optical waveguides can be coupled into the edge body via the optical waveguides, guided within the edge body, can be mixed with light of different colors in the edge body and leave the edge body at a different location. The light mixer can be formed for example in the shape of a circle. Accordingly, the edge body can be formed in a ring-shaped manner and the optical waveguides can extend within the edge body from one side of the edge body to the other side of the edge body.

According to one development, the light-emitting assembly comprises a light-sensitive sensor which is arranged in such a way that light coupled into the optical waveguides is at least partially guided towards the light-sensitive sensor. The light-sensitive sensor can be arranged, for example, directly below one of the optical waveguides or below the edge body, so that light, which is mixed by the optical waveguides or the edge body and coupled out above the sensor in the direction of the sensor, impinges on the sensor and can be detected by the sensor. If the sensor is arranged outside a region in which the light-emitting components are arranged, the light mixer, for example the edge body, can have a section extending from the region, in which the light-emitting components are arranged, up to and above the sensor. For example, this section can be formed in one piece with the edge body.

According to one development, the first, second and/or third light-emitting components each have at least one LED. In particular, the first light-emitting components comprise first LEDs, the second light-emitting components second LEDs and the third light-emitting components third LEDs.

According to one development, the first, second and/or third light-emitting components each have a converter layer or a part of a converter layer arranged between the corresponding LEDs and the optical waveguides which is configured for converting light generated by the corresponding LED. For example, a first conversion layer can be formed above the first LEDs and a second conversion layer can be formed above the second LEDs. The conversion layers can each have a carrier material in which converter material is embedded. The converter material can have converter particles. Alternatively, the conversion layers can be formed from the converter material. The converter material is suitable for converting light with respect to its wavelength. For example, the first LEDs emit blue light, the converter material absorbs at least a part of the blue light and emits yellow or hazy blue light. The yellow and/or hazy blue light mix/mixes with the remaining unconverted blue light, as a result of which white light can be generated. Alternatively, the blue light can be converted into yellow light by the converter material and the blue light can be converted into bluish white light by another converter material, as a result of which adjustable or tunable white light can be generated. Furthermore, green light can be generated, for example by blue light-emitting LEDs and a conversion layer absorbing the blue light and emitting the green light, red light can be generated by second LEDs, for example directly or by means of one corresponding conversion layer, and blue light or white light can be generated by a third group of LEDs for example directly or by means of a corresponding conversion layer. An LED having the associated conversion layer or the associated part of the conversion layer, i.e. the part of the conversion layer arranged directly above the corresponding LED, form one of the light-emitting components.

According to one development, the first light-emitting components emit red light and/or comprise surface-emitting LEDs. Alternatively or additionally, the second light-emitting components emit blue light and/or comprise volume-emitting LEDs. Alternatively or additionally, the third light-emitting components emit green light.

The object is solved according to a further aspect of the invention by a method for producing a light-emitting assembly in which a substrate is provided; first light-emitting components emitting first light of a first color during operation of the light-emitting assembly are arranged on the substrate along a first line; second light-emitting components emitting second light of a second color during operation of the light-emitting assembly are arranged on the substrate along a second line, wherein the first line extends laterally next to the second line; and a plurality of optical waveguides for guiding light are arranged above the light-emitting components in such a way that they extend in a direction from the first line to the second line and intersect the first line and the second line.

The advantages and/or embodiments of the light-emitting assembly explained above can readily be applied to the method for producing the light-emitting assembly.

The object is solved according to a further aspect of the invention by a light mixer for mixing light of a first color generated by a plurality of first light-emitting components and light of a second color generated by a plurality of second light-emitting components, the light mixer comprises a plurality of rod-shaped optical waveguides arranged laterally next to one another and spaced apart from one another, and an edge body connected to the optical waveguides for holding the optical waveguides. The advantages and/or embodiments of the light mixer or of the optical waveguides explained in connection with the light-emitting assembly can readily be applied to the optical waveguide per se, that is to say independently from the light-emitting assembly.

Brief Description of the Figures:

Exemplary embodiments of the invention are illustrated in the figures and are explained in more detail below.

FIG. 8 shows a flow chart of an exemplary embodiment of a method for producing a light-emitting assembly.

Figure 1:
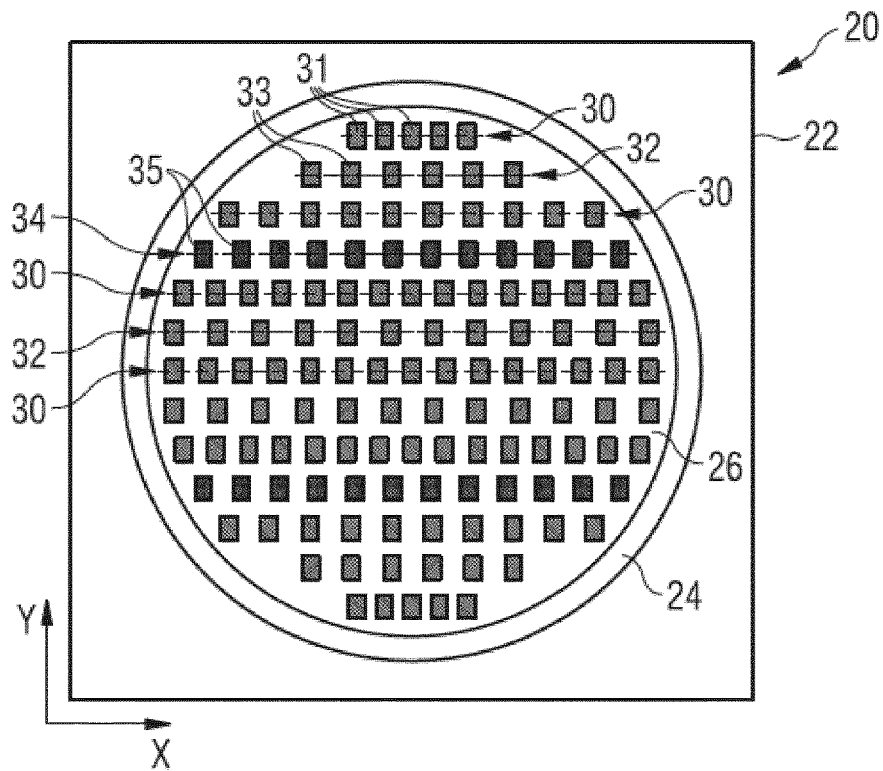
FIG. 1 shows a plan view of a conventional light-emitting diode arrangement.

In the following detailed description, reference is made to the attached drawings which form part of this description and in which specific exemplary embodiments are shown for the purpose of illustration, in which the invention can be applied. Since the components of the embodiments can be positioned in different orientations, the directional terminology is only for the purpose of illustration and is not restricted in any way. It is to be understood that other exemplary embodiments can be used and structural or logical changes can be made without departing from the scope of protection of the present invention. It is to be understood that the features of the various exemplary embodiments described herein can be combined with one another unless specifically stated otherwise. The following detailed description is therefore not to be interpreted in a restrictive sense, and the scope of protection of the present invention is defined by the appended claims. In the figures, identical or similar elements are provided with identical reference characters insofar as this is expedient.

A light-emitting assembly may comprise one, two or more light-emitting components. Optionally, a light-emitting assembly can also comprise one, two or more electronic components. For example, the electronic component can comprise an active and/or a passive component. The active electronic component can comprise, for example, a computing, control and/or a regulating unit and/or a transistor. The passive electronic component can comprise, for example, a capacitor, a resistor, a diode or a coil.

In various exemplary embodiments, a light-emitting component can be a light-emitting semiconductor component and/or can be formed as a light-emitting diode (LED), an organic light-emitting diode (OLED), a light-emitting transistor or as an organic light-emitting transistor. The radiation can be, for example, light in the visible range, UV light and/or infrared light.

FIG. 1 shows a plan view of a conventional light-emitting diode arrangement 20. The conventional light-emitting diode arrangement 20 comprises a substrate 22 on which an optically active region of the light-emitting diode arrangement 20 is formed. In the optically active region of the conventional light-emitting diode arrangement 20, the conventional light-emitting diode arrangement 20 emits light during its operation. On the substrate 22, the optically active region is delimited by a dam 24 in lateral direction. In a plan view onto the substrate 22, the dam 24 is formed in a circular manner.

The conventional light-emitting diode arrangement 20 has first light-emitting diode strings 30, second light-emitting diode strings 32 and third light-emitting diode strings 34. The first light-emitting diode strings 30 have first light-emitting components 3 emitting in each case light of a first color. The second light-emitting diode strings 32 have second light-emitting components 33 emitting in each case light of a second color. The third light-emitting diode strings 34 have third light-emitting components 35 emitting in each case light of a third color.

The first light-emitting diode strings 30 and the first light-emitting components 31 of one of the first light-emitting diode strings 30 are arranged in each case along first lines represented by dashed lines in the figures. The second light-emitting diode strings 32 and the second light-emitting components 33 of one of the second light-emitting diode strings 32 are arranged in each case along second lines represented by dotted lines in the figures. The third light-emitting diode strings 34 and the third light-emitting components 35 of one of the third light-emitting diode strings 34 are arranged in each case along third lines represented as dash-dot lines in the figures. The light-emitting diode strings 30, 32, 34 are arranged in the optically active region of the conventional light-emitting diode arrangement 20. The light-emitting diode strings 30, 32, 34 are formed in a straight manner, i.e. in a linear manner, and run parallel to each other on the substrate 22.

The first light-emitting components 31 have first light-emitting diodes, the second light-emitting components 33 have second light-emitting diodes and the third light-emitting components 35 have third light-emitting diodes. The first, second and third light-emitting diodes are light-emitting diodes emitting blue light and can be volume-emitting light-emitting diodes and/or can comprise sapphire chips. Conversion layers, which comprise converter materials converting the blue light emitted by the first light-emitting diodes into red light, are formed on or above the first light-emitting diodes of the first light-emitting diode strings 30. Conversion layers, which comprise converter materials converting the blue light emitted by the second light-emitting diodes into green light, are formed on or above the second light-emitting diodes of the second light-emitting diode strings 32. No conversion layers are formed on or above the third light-emitting diodes of the third light-emitting diode strings 34, so that the blue light is not converted.

Together with the overlying partial region of the corresponding conversion layer, each first light-emitting diode forms one of the first light-emitting components 31. Together with the overlying partial region of the corresponding conversion layer, each second light-emitting diode forms one of the second light-emitting components 33. Each third light-emitting diode forms one of the third light-emitting components 35. The red light emitted by the first light-emitting diodes is mixed with the green light generated by the second light-emitting diodes and with the blue light generated by the third light-emitting diodes, so that mixed light, in particular white light, occurs and thus is emitted by the conventional light-emitting diode arrangement 20.

Due to the linear, parallel arrangement of the light-emitting diode strings 30, 32, 34 on the level of the substrate, the red, blue and green light are not mixed particularly well and only have a low rate of light mixing. This leads to the effect that during operation of the conventional light-emitting diode arrangement 20, the parallel lines of the light-emitting diode strings 30, 32, 34 are visible, for example, when viewing onto substrate 22 and/or projecting the generated mixed light onto a surface.

The substrate 22 lies in an XY plane which extends in the X-direction and the Y-direction and is illustrated by corresponding X- and Y-arrows in FIG. 1. The light-emitting diode strings 30, 32, 34 and the corresponding lines each extend in the X-direction. Different light-emitting diode strings 30, 32, 34 and the corresponding lines are spaced apart from one another in the Y-direction. In the present application, a lateral direction, in particular "lateral", denotes a direction lying in the XY plane. A vertical direction, in particular the term "vertical", denotes a direction perpendicular to the XY plane.

Figure 2:
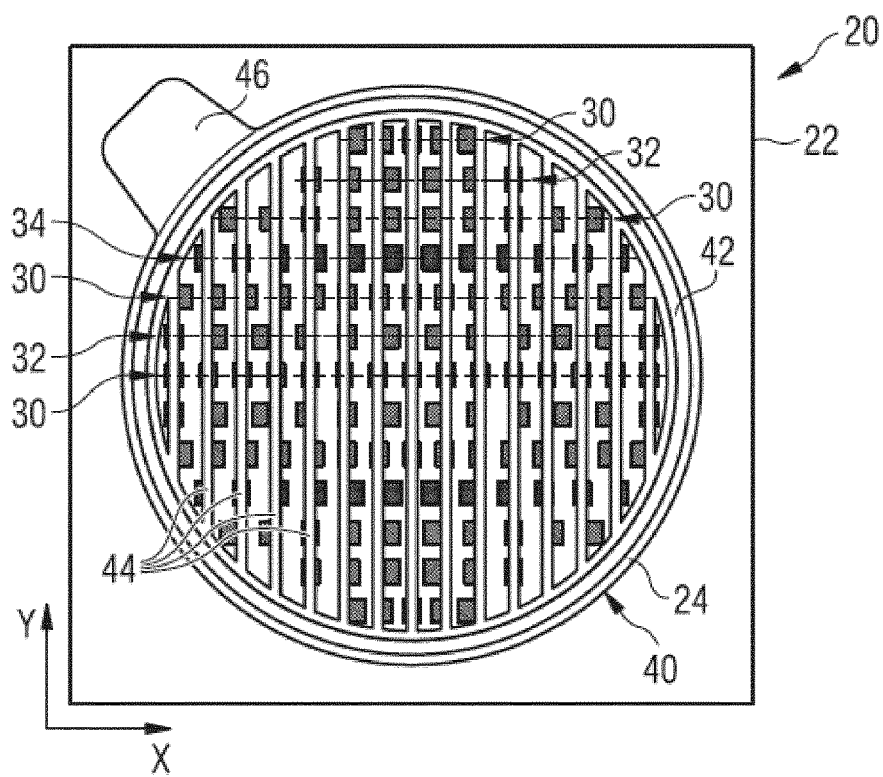
FIG. 2 shows a top view of an exemplary embodiment of a light-emitting assembly.

FIG. 2 shows an exemplary embodiment of a light-emitting assembly comprising a light-emitting diode arrangement 20 which corresponds to the conventional light-emitting diode arrangement 20 as shown in FIG. 1. At this point, a renewed explanation of the light-emitting diode arrangement 20 is therefore dispensed with and reference is made in this regard to the explanation of FIG. 1.

In addition to the light-emitting diode arrangement 20, the light-emitting assembly comprises a light mixer 40. The light mixer 40 is arranged vertically above the substrate 22 and fixed to the substrate 22. The light mixer 40 has an edge body 42. The edge body 42 is formed, for example, in a circular manner. The light mixer 40 has a plurality of rod-shaped optical waveguides 44 which extend within the edge body 42, are held by the edge body 42 and are physically connected to the edge body 42. The optical waveguides 44 are straight and spaced apart from one another. Interspaces are formed between the optical waveguides 44 which can be filled with a casting material or a gas, for example with air. The optical waveguides are arranged parallel to one another. Optionally, the light mixer 40 has a section 46 which extends radially outwards from the edge body 42. The light mixer 40, in particular the optical waveguides 44, the edge body 42 and/or the section 46 can be formed in one piece and/or translucent or transparent and/or comprise a transparent carrier material in which scattering particles are embedded.

Thus, the light mixer 40 is arranged above the substrate 22 so that the optical waveguides 44 are arranged above the light-emitting components 31, 33, 35 in such a way that the optical waveguides 44 extend from one of the light-emitting diode strings 30, 32, 34 and the corresponding line to another one of the light-emitting diode strings 30, 32, 34 and the corresponding line. In particular, the optical waveguides 44 intersect the light-emitting diode strings 30, 32, 34 and the corresponding first, second and third lines at a right angle.

The light mixer 40 and in particular the optical waveguides 44 cause light of a color, which is generated by the light-emitting components 31, 33, 35 along one of the light-emitting diode strings 30, 32, 34, to be coupled into the optical waveguides 44 and to propagate within the optical waveguides 44 to another one of the light-emitting diode strings 30, 32, 34, from which light of a different color is coupled into the optical waveguides 44. For example, within the optical waveguides 44, the first light of one of the first light-emitting diode strings 30 is carried via one of the second light-emitting diode strings 32 and one of the third light-emitting diode strings 34 and is mixed within the optical waveguides 44 with the second or third light coupled therein. Similarly, within the optical waveguides 44, the second light of one of the second light-emitting diode strings 32 is carried via one of the first light-emitting diode strings 30 and one of the third light-emitting diode strings 34 and is mixed within the optical waveguides 44 with the first or third light coupled therein. Similarly, within the optical waveguides 44, the third light of one of the third light-emitting diode strings 34 is carried via one of the first light-emitting diode strings 30 and one of the second light-emitting diode strings 32 and is mixed within the optical waveguides 44 with the first or second light coupled therein. From the optical waveguides 44 the light mixed within the optical waveguides 44 is coupled out at least partially in the vertical direction from the light mixer 40 and is emitted as mixed light from the light-emitting assembly.

Light, which is generated by the light-emitting components 31, 33, 35 and is not coupled into the optical waveguides 44, can propagate between the optical waveguides 44 in an unhindered manner along the vertical direction and can be mixed with the light mixed by the optical waveguides 44 during and after passing through the optical waveguides 44.

In addition to the optical waveguides 44, the light coupled into the optical waveguides 44 can propagate within the edge body 42 and/or the section 46, can be mixed therein and/or emitted from there. If the light-emitting assembly comprises a light-sensitive sensor for detecting the mixed light, this sensor can be formed for example below the section 46 and can receive and detect mixed light coupled out from the section 46.

As an alternative to the exemplary embodiment shown in FIG. 1, the light-emitting diode strings 30, 32, 34 and the corresponding first, second and/or third lines may not be straight but curved, for example, and/or may not be aligned parallel to one another. Alternatively or additionally, more or fewer light-emitting diode strings 30, 32, 34 and corresponding lines can be formed. Furthermore, each of the light-emitting diode strings 30, 32, 34 can have more or less light-emitting components 31, 33, 35 as illustrated. Furthermore, only two or more than three different types of light-emitting components 31, 33, 35, which thus emit only light of two different colors or light of more than three different colors, and the corresponding light-emitting diode strings 30, 32, 34 may be arranged along the corresponding lines. Moreover, the light-emitting diodes are not only restricted to light-emitting diodes emitting blue light, volume-emitting light-emitting diodes and/or sapphire chips, but can also emit light of different colors, for example red light, and/or can be surface-emitting light-emitting diodes. In addition, more, less and/or other conversion layers can be provided for generating light of different colors. Alternatively or additionally, the light mixer 40 can be arranged in such a way that the optical waveguides 44 do not intersect the lines at a right angle, but at an acute or obtuse angle, for example. Alternatively or additionally, the optical waveguides 44 do not have to be straight, for example curved, and/or parallel to each other. Furthermore, the light mixer 40 does not have to be formed in one piece. For example, the optical waveguides 44 and the edge body are mutually independent bodies which are only firmly connected to each other. Furthermore, in particular if no sensor is arranged in the edge region of the substrate 22, the section 46 can be dispensed with.

Figure 3:
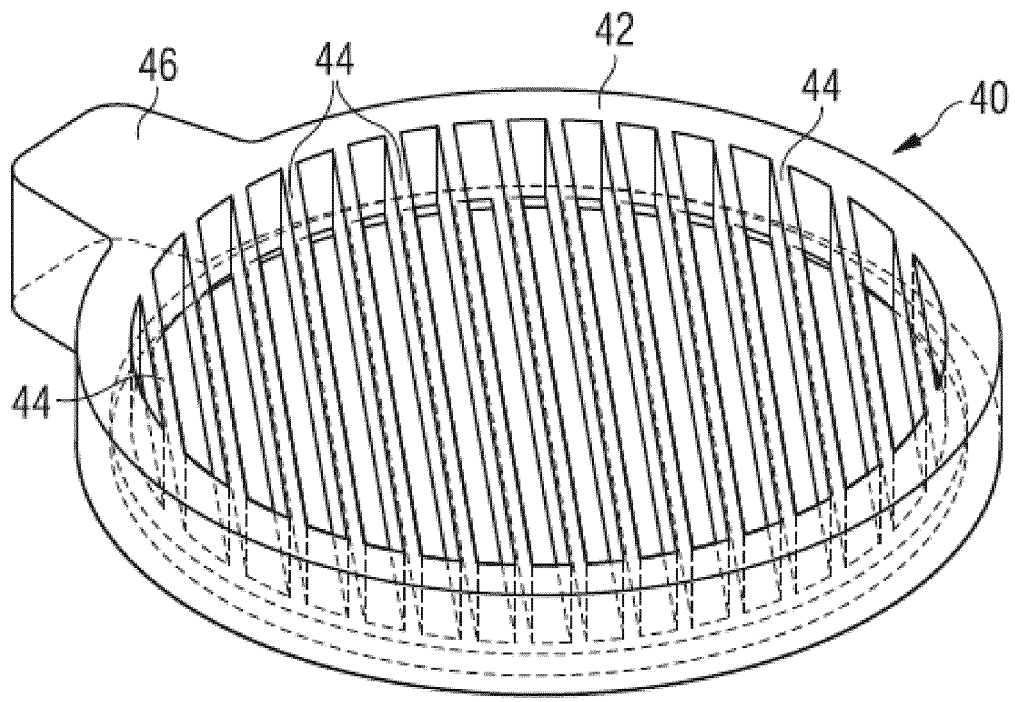
FIG. 3 shows a perspective view of a light mixer of the light-emitting assembly according to FIG. 2.

FIG. 3 shows a perspective view of the light mixer 40 of the light-emitting assembly according to FIG. 2. It is apparent from FIG. 3 that the light mixer 40 is formed in one piece and in a translucent manner.

Alternatively, the light mixer 40 can be formed from a plurality of pieces, for example the edge body 42 can be formed in one piece and the optical waveguides 44 and/or optionally the section 46 can be fixed to the edge body 42.

Figure 4:
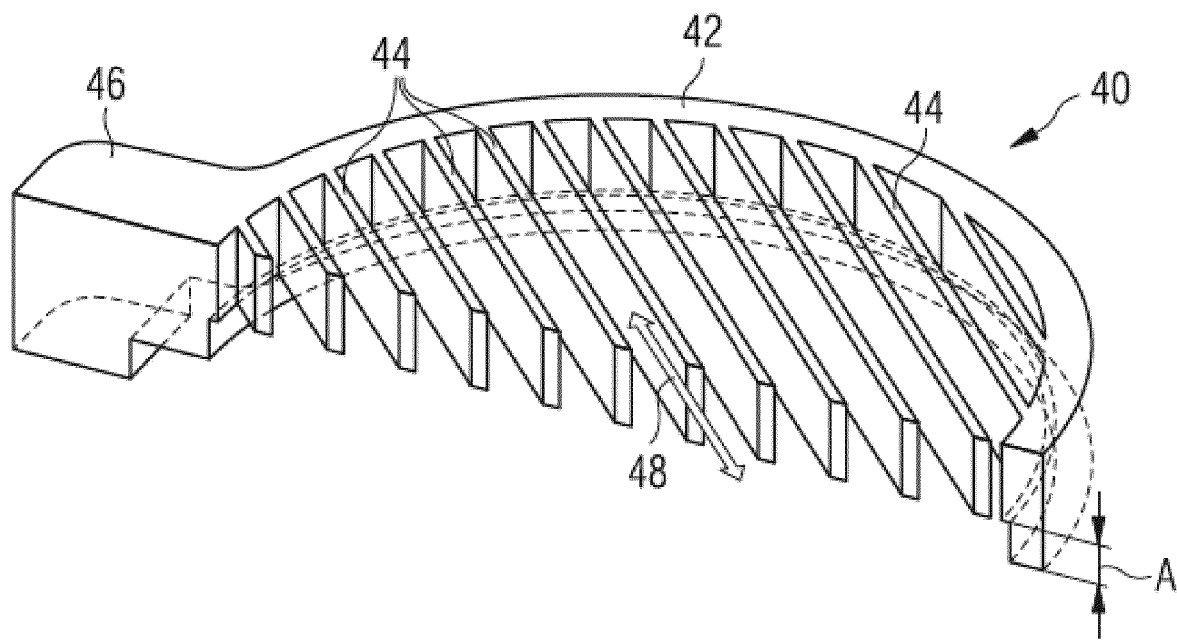
FIG. 4 shows a sectional view of the light mixer according to FIG. 3.

FIG. 4 shows a sectional view of the light mixer 40 according to FIG. 3. A light mixing direction 48 is shown in FIG. 4. The light coupled into the optical waveguides 44 propagates along the light mixing direction 48. Since the optical waveguides 44 extend over different light-emitting components 31, 33, 35 emitting the light of different colors and over the corresponding light-emitting diode strings 30, 32, 34 and since the light coupled into the optical waveguides 44 propagates along the light mixing direction 48, light of different colors is mixed within the optical waveguides 44.

The light mixer 40 is formed in such a way that the optical waveguides 44 have a predetermined distance A along the vertical direction towards the light-emitting components 31, 33, 35 when arranging the light mixer 40 on the substrate 22. This has the effect that on the one hand, light of the different colors can be already mixed to a certain degree before being coupled into the optical waveguides, and on the other hand, heat arising during operation of the light-emitting assembly cannot be transferred directly, in particular through physical contact, from the light-emitting components 31, 33, 35 to the optical waveguides 44. Due to the distance A, the interspace formed between the light-emitting components 31, 33, 35 and the optical waveguides 44 can be filled, for example, with a potting material and/or with a gas, for example with air.

Figure 5:
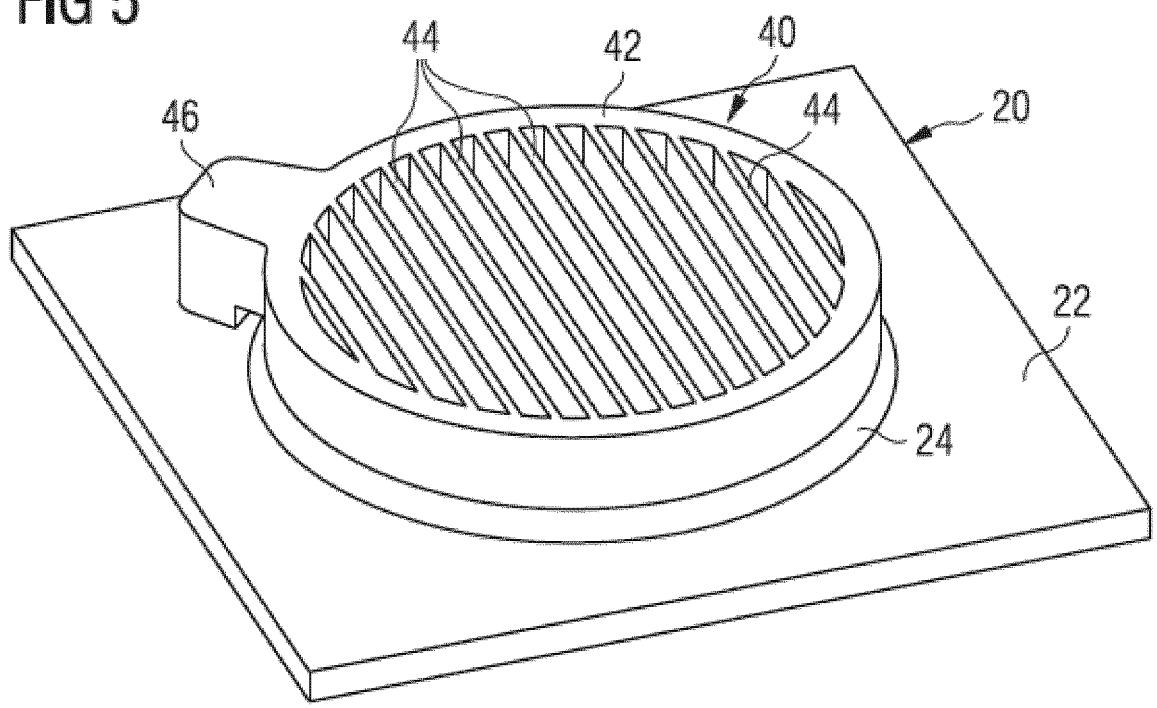
FIG. 5 shows a perspective view of the light-emitting assembly according to FIG. 2.

FIG. 5 shows a perspective view of the light-emitting assembly according to FIG. 2.

Figure 6:
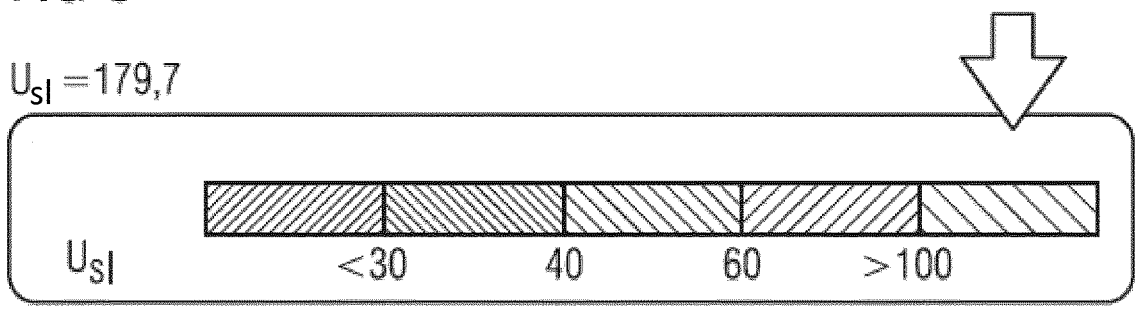
FIG. 6 shows a first diagram for representing the rate of light mixing of the conventional light-emitting diode arrangement according to FIG. 1.

FIG. 6 shows a first diagram illustrating a light mixing rate of the conventional light-emitting diode arrangement according to FIG. 1. The rate of light mixing was determined according to a method explained in the paper "Merit function for the evaluation of color uniformity in the far field of LED spot lights", Proc. SPIE 9003, Light-Emitting Diodes: Materials, Devices, and Applications for Solid State Lighting XVIII, 900303 (Feb. 27, 2014); doi:10.1117/12.2043545. In the first diagram represented by differently hatched areas, the rate of light mixing is given as Us1. In principle, visual perception shall be seen as excellent for Us1 of less than 30, good for Us1 between 30 and 40, acceptable for Us1 between 40 and 60, unsuitable for between 60 and 100 and insufficient for greater than 100. Regarding the conventional light-emitting diode arrangement, according to FIG. 1, the value of Us1 representing by the large arrow in the first diagram is 179.7 and thus insufficient.

The first diagram shows that the rate of light mixing without the light mixer 40 is low and insufficient.

Figure 7:
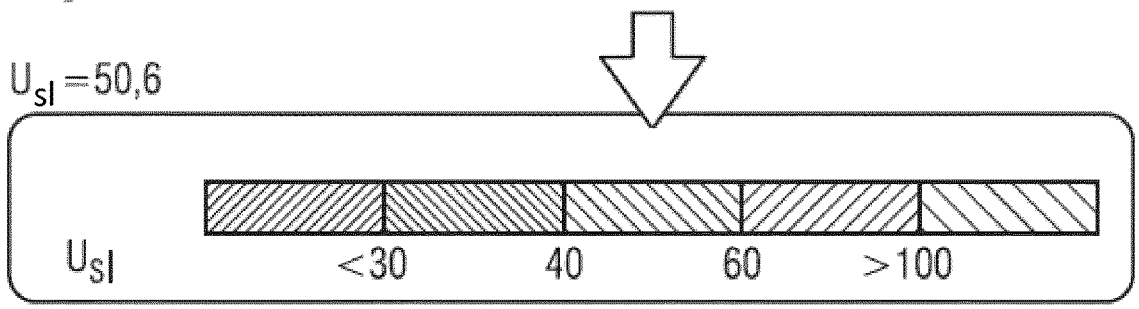
FIG. 7 shows a second diagram for representing the rate of light mixing of the light-emitting assembly according to FIG. 2.

FIG. 7 shows a second diagram illustrating a light mixing rate of the light-emitting assembly according to FIG. 2. The second diagram was determined according to the same method as the first diagram. The second diagram shows that represented in the second diagram by a large arrow, the value Us1 of the light-emitting assembly according to FIG. 2 is equal to 50.6, and the rate of light mixing with the light mixer 40 is thus increased compared to the case without a light mixer 40 and in total is acceptable. In particular, the second diagram shows that it is sufficient if the light mixing takes place exclusively from one of the lines and the corresponding light-emitting diode string 30, 32, 34 to another one of the lines and the corresponding light-emitting diode string 30, 32, 34, as it is achieved by means of the light mixer 40.

FIG. 8 shows a flow chart of an exemplary embodiment of a method for producing a light-emitting assembly.

According to step S2, a substrate is provided, for example the substrate 22 explained above.

During step S4, first light-emitting components are arranged. For example, the first light-emitting components 31 are arranged along the first lines on the substrate 22 so that they form the first light-emitting diode strings 30 and are electrically connected to conductor tracks on the substrate 22.

During step S6, second light-emitting components are arranged. For example, the second light-emitting components 33 are arranged along the second lines on the substrate so that they form the second light-emitting diode strings 32 and are electrically connected to conductor tracks on the substrate 22.

Optionally, third light-emitting components, for example the third light-emitting components 35, can be arranged along the third lines and electrically connected to conductor tracks on the substrate 22.

During step S8, optical waveguides are arranged. For example, the optical waveguides 44 explained above are arranged over the light-emitting components 31, 33, 35. By way of example, the light mixer 40 comprising the optical waveguides 44 explained above can be arranged on the substrate 22 in such a way that the optical waveguides 44 each extend over different light-emitting diode strings 30, 32, 34.

The invention is not restricted to the indicated exemplary embodiments. For example, the light-emitting assembly can have more or less light-emitting diode strings 30, 32, 34. Alternatively or additionally, each of the light-emitting diode strings 30, 32, 34 can have more or less light-emitting components 31, 33, 35. Alternatively or additionally, only two different types of light-emitting components 31, 33, 35 or more than three different types of light-emitting components 31, 33, 35 can be arranged. Furthermore, the lines and/or the light-emitting diode strings 30, 32, 34 can be formed to be not parallel to one another, not straight and/or curved. Moreover, the optical waveguides 44 may be formed to be not parallel to one another, not straight and/or curved and/or not at right angle to the lines and/or to the light-emitting diode strings 30, 32, 34.

LIST OF REFERENCE NUMERALS

Light-emitting diode arrangement 20
Substrate 22
Dam 24
First light-emitting diode string 30
First light-emitting components 31
Second light-emitting diode string 32
Second light-emitting components 33
Third light-emitting diode string 34
Third light-emitting components 35
Light mixer 40
Edge body 42
Optical waveguide 44
Section 46
Steps of two to eight S2-S8

The invention claimed is:

1. A light-emitting assembly comprising:
   a substrate,
   first light-emitting components which are arranged on the substrate along a first line and emit first light of a first color,
   second light-emitting components which are arranged on the substrate along a second line and emit second light of a second color, wherein the first line runs laterally next to the second line,
   a plurality of rod-shaped optical waveguides for guiding light, which are arranged over the light-emitting components, extend in a direction from the first line to the second line and intersect the first line and the second line, and
   an edge body which (i) is formed in one piece with the optical waveguides, (ii) is arranged on the substrate, (iii) protrudes from the substrate in vertical direction, (iv) surrounds the light-emitting components in lateral direction, and (v) is transparent or translucent.

2. The light-emitting assembly according to claim 1, wherein the first line and/or the second line are straight in lateral direction.

3. The light-emitting assembly according to claim 2, wherein the first line and the second line are parallel to each other.

4. The light-emitting assembly according to claim 1, wherein the optical waveguides are straight in lateral direction.

5. The light-emitting assembly according to claim 1, wherein the optical waveguides intersect the lines at a right angle.

6. Light-emitting assembly according to claim 1 comprising third light-emitting components which are arranged on the substrate along a third line and emit third light of a third color, wherein the third line is arranged laterally next to the first line and the second line, and intersects the optical waveguides.

7. The light-emitting assembly according to claim 1 having a plurality of first lines of first light-emitting components, a plurality of second lines of second light-emitting components and/or a plurality of third lines of third light-emitting components.

8. The light-emitting assembly according to claim 1, wherein in vertical direction the optical waveguides have a predetermined distance greater than zero towards the light-emitting components.

9. The light-emitting assembly according to claim 1 comprising a light-sensitive sensor which is arranged in such a way that light coupled into the optical waveguides is at least partially guided towards the light-sensitive sensor.

10. The light-emitting assembly according to claim 1, wherein each of the first, second and/or third light-emitting components has at least one LED.

11. The light-emitting assembly according to claim 10, wherein the first, second and/or third light-emitting components each have a converter layer or a part of a converter layer which is formed between the corresponding LEDs and the optical waveguides and serves for converting light generated by the corresponding LED.

12. The light-emitting assembly according to claim 1, wherein the first light-emitting components emit red light and/or comprise surface-emitting LEDs, the second light-emitting components emit blue light and/or comprise volume-emitting LEDs, and/or the third light-emitting components emit green light.

13. A method for producing the light-emitting assembly according to claim 1, in which
   the substrate is provided,
   the first light-emitting components emitting the first light of the first color during operation of the light-emitting assembly are arranged on the substrate along the first line, the second light-emitting components emitting the second light of the second color during operation of the light-emitting assembly are arranged on the substrate along the second line, wherein the first line extends laterally next to the second line, the plurality of optical waveguides for guiding light are arranged above the light-emitting components in such a way that they extend in a direction from the first line to the second line and intersect the first line and the second line, and the edge body is arranged on the substrate such that it protrudes from the substrate in vertical direction, surrounds the light-emitting components in lateral direction and is transparent or translucent.

14. A light mixer comprising the light-emitting assembly according to claim 1 for mixing light of the first color generated by the plurality of first light-emitting components and light of the second color generated by the plurality of second light-emitting components, the light mixer comprising:

the plurality of rod-shaped optical waveguides arranged laterally next to one another and spaced apart from one another, and the edge body connected to the optical waveguides for holding the optical waveguides.

15. A light-emitting assembly comprising:

a substrate, first light-emitting components which are arranged on the substrate along a first line and emit first light of a first color, second light-emitting components which are arranged on the substrate along a second line and emit second light of a second color, wherein the first line runs laterally next to the second line, and a plurality of rod-shaped optical waveguides for guiding light, which are arranged over the light-emitting components, extend in a direction from the first line to the second line and intersect the first line and the second line, wherein the light-emitting assembly comprises one of the following additional features:

i) interspaces extending from one of the rod-shaped optical waveguides to another one of the rod-shaped optical waveguides extend along the first or second lines, and the interspaces are free of a potting material and/or of scattering particles, wherein light generated by the light-emitting components can exit from the light-emitting assembly through the interspaces in an unhindered manner;

ii) light, which is generated by the light-emitting components and is not coupled into the optical waveguides, propagates between the optical waveguides in an unhindered manner along a vertical direction; or iii) light, which is generated by the light-emitting components and is not coupled into the optical waveguides, propagates in regions between the optical waveguides in an unhindered manner along a vertical direction and is mixed with the light mixed by the optical waveguides during and after passing through the optical waveguides.

16. A light-emitting assembly comprising:

a substrate, first light-emitting components which are arranged on the substrate along a first line and emit first light of a first color, second light-emitting components which are arranged on the substrate along a second line and emit second light of a second color, wherein the first line runs laterally next to the second line, and a plurality of rod-shaped optical waveguides for guiding light, which are arranged over the light-emitting components, extend in a direction from the first line to the second line and intersect the first line and the second line, wherein the rod-shaped optical waveguides are spaced apart from one another so that light, which is generated by the light-emitting components and is not coupled into the rod-shaped optical waveguides, can pass the rod-shaped optical waveguides and exit from the light-emitting assembly without being coupled into the rod-shaped optical waveguides.

* * * * *